US007030452B2

(12) United States Patent
Tao et al.

(10) Patent No.: US 7,030,452 B2
(45) Date of Patent: Apr. 18, 2006

(54) APPARATUS AND METHOD FOR FABRICATING ARRAYS OF ATOMIC-SCALE CONTACTS AND GAPS BETWEEN ELECTRODES AND APPLICATIONS THEREOF

(75) Inventors: Nongjian Tao, Phoenix, AZ (US); Salah Boussaad, Tempe, AZ (US)

(73) Assignee: Arizona Board of Regents, Tempe, AZ (US)

(*) Notice: Subject to any disclaimer, the term of this patent is extended or adjusted under 35 U.S.C. 154(b) by 190 days.

(21) Appl. No.: 10/795,151

(22) Filed: Mar. 4, 2004

(65) Prior Publication Data

US 2004/0169243 A1  Sep. 2, 2004

Related U.S. Application Data

(62) Division of application No. 10/305,708, filed on Nov. 27, 2002, now Pat. No. 6,737,286.

(60) Provisional application No. 60/334,573, filed on Nov. 30, 2001.

(51) Int. Cl.
*H01L 27/14* (2006.01)
*H01L 29/82* (2006.01)
*H01L 29/84* (2006.01)

(52) U.S. Cl. ........................ 257/414; 205/775
(58) Field of Classification Search ............... 257/414; 438/689, 17; 205/775; 435/6
See application file for complete search history.

(56) References Cited

U.S. PATENT DOCUMENTS 4,338,157 A    7/1982  Kanda
6,326,215 B1 * 12/2001 Keen .................. 436/518
6,506,296 B1    1/2003  Babes-Dornea et al.
6,655,010 B1 * 12/2003 Hatfield et al. ............ 29/610.1
6,699,667 B1 *  3/2004 Keen .................. 435/6
6,737,286 B1 *  5/2004 Tao et al. .............. 438/17
6,773,926 B1 *  8/2004 Freund et al. .......... 436/149
2002/0015963 A1 *  2/2002 Keen .................. 435/6
2003/0079999 A1 *  5/2003 Penner et al. ......... 205/775
2004/0023253 A1 *  2/2004 Kunwar et al. ........ 435/6
2004/0067646 A1 *  4/2004 Tao et al. ............ 438/689
2004/0104129 A1 *  6/2004 Gu et al. ............. 205/775
2004/0169243 A1 *  9/2004 Tao et al. ............ 257/414

OTHER PUBLICATIONS

Bogozi, A., et al., "Molecular Adsorption onto Metallic Quantum Wires," *J. Am. Soc.* 2001, 123, pp. 4585-4590, American Chemical Society.

(Continued)

*Primary Examiner*—Laura M. Schillinger
(74) *Attorney, Agent, or Firm*—Robert D. Atkins; Quarles & Brady Streich Lang LLP

(57) ABSTRACT

A method for forming atomic-scale contacts and atomic-scale gaps between two electrodes is disclosed. The method provides for applying a voltage between two electrodes in a circuit with a resistor. The applied voltage etches metal ions off one electrode and deposits the metal ions onto the second electrode. The metal ions are deposited on the sharpest point of the second electrode, causing the second electrode to grow towards the first electrode until an atomic-scale contact is formed. By increasing the magnitude of the resistor, the etching and deposition process will terminate prior to contact, forming an atomic-scale gap. The atomic-scale contacts and gaps formed according to this method are useful as a variety of nanosensors including chemical sensors, biosensors, hydrogen ion sensors, heavy metal ion sensors, magnetoresistive sensors, and molecular switches.

16 Claims, 7 Drawing Sheets

OTHER PUBLICATIONS

Boussaad, S. et al., "Atom-size gaps and contacts between electrodes fabricated with a self-terminated electrochemical method," *Applied Physics Letters*, pp. 2398-2400, vol. 80, No. 13, Apr. 1, 2002, American Institute of Physics.

Favier, F., et al., "Hydrogen Sensors and Switches from Electrodeposited Palladium Mesowire Arrays," *Science*, vol. 293, pp. 2227-2231, Sep. 21, 2001.

Garcia, N. et al., "Magnetoresistance in excess of 200% in Ballistic Ni Nanocontacts at Room Temperature and 100 Oe," *Physical Review Letters*, vol. 82, No. 14, pp. 2923-2926, Apr. 5, 1999, American Physical Society.

Handley, J. "Stretching the Wire Frontier," Apr. 1, 2002, pp. 196A-199A, vol. 74, Issue 7.

Kim, S. et al., "Development of 3-D focus-ion-beam (FIB) etching method for nano and micro technology application", Microprocesses and Nanotechnology Conference 2001 International, pp. 34-35.

Klep, I. et al., "Technology of silicon nano- and microelectrode array for pollution control", Semiconductor Conference 2001, CAS 2001 Proceedings International, vol., pp. 39-42.

Li, C. et al., "Fabrication of stable metallic nanowires with quantized conductance," *Nanotechnology* 10, 1999, pp. 221-223, IOP Publishing, Ltd.

Li, C., et al., "Molecular detection based on conductance quantization of nanowires," *Applied Physics Letters*, pp. 1333-1335, vol. 76, No. 10, Mar. 6, 2000, American Institute of Physics.

Li, C., et al., "Quantum transport in metallic nanowires fabricated by electrochemical deposition/dissolution," *Applied Physics Letters*, pp. 894-896, vol. 72, No. 8, Feb. 23, 1998, American Institute of Physics.

Morpurgo, A., et al., "Controlled fabrication of metallic electrodes with atomic separation," *Applied Physics Letters*, pp. 2084-2086, vol. 74, No. 14, Apr. 5, 1999, American Institute of Physics.

Toriyama, S. et al., "Characteristics of silicon nano wire as piezoresistor for nano electro mechanical systems", Micro Electro Mechanical System 2001 MEMS 2001, 14th IEEE International Conference, pp. 305-308.

* cited by examiner

APPARATUS AND METHOD FOR FABRICATING ARRAYS OF ATOMIC-SCALE CONTACTS AND GAPS BETWEEN ELECTRODES AND APPLICATIONS THEREOF

CLAIM TO DOMESTIC PRIORITY

This application is a divisonal of prior application Ser. No. 10/305,708 filed Nov. 27, 2002 now U.S. Pat. No. 6,737,286.

The present non-provisional patent application claims priority to provisional application Ser. No. 60/334,573, entitled "An Automated Method to Fabricate Arrays of Atomic-Scale Contacts and Molecular-Scale Gaps between Electrodes," filed on Nov. 30, 2001, by Nongjian Tao and Salah Boussaad.

GOVERNMENT LICENSE RIGHTS

The U.S. Government has a paid-up license in this invention and the right in limited circumstances to require the patent owner to license others on reasonable terms as provided for by the terms Grant No. CHE-9818073 (DWA0068) awarded by the NSF and Grant No. F49620-99-1-0112 (DWJ9206) awarded by the AFOSR.

FIELD OF THE INVENTION

The present invention relates generally to an apparatus and method for fabricating nanostructured sensors and devices, and more specifically, to an apparatus and method for mass-fabrication of atomic-scale contacts and gaps between metallic electrodes for use in electronic, chemical, and biological sensor devices.

BACKGROUND OF THE INVENTION

Chemical and biological sensors, magnetoresistive sensors, and molecular electronic and optoelectronic devices can be miniaturized using nanowires, mesowires, or carbon nanotubes. Continued advances in nanoscience and nanotechnology require tiny sensors and devices to analyze small sample sizes. Additionally, miniature sensors are useful in cellular and molecular analysis of biological systems. In producing miniature sensors and devices, atom-size gaps and contacts between metal electrodes need to be fabricated.

Atomic-scale contacts between metal electrodes have been traditionally created by mechanically breaking a fine metal wire and separating the two metal electrodes in contact. An apparatus, such as a stepping motor or piezoelectirc transducer, is typically used to control the breaking and separating. The atomic-scale contacts fabricated by mechanical means cannot be removed from the apparatus. Therefore, mass-production and multi-application is impractical.

One non-mechanical method of fabricating atomic-scale contacts uses an aluminum wire anodized locally with an atomic force microscope. However, the use of an atomic force microscope also makes mass-production impractical. A second non-mechanical method uses electrochemical deposition and etching. However, the deposition and etching process does not have a self-termination method, and thus, is also impractical for mass-production.

Conventional microfabrication techniques of gaps between electrodes include electron beam lithography-based techniques. Such lithography-based techniques are not capable of producing molecule-sized or atom-size gaps. The Scanning Probe Microscope and the mechanically controllable break junction techniques have also been used to fabricate two electrodes with a molecular-scale gap. Because of the apparatuses involved with both fabrication methods, mass-production of molecular-scale gaps is impractical.

Electrochemical etching and deposition have also been using to fabricate molecular-scale gaps. However, the method lacks a self-termination mechanism which seriously hinders mass-production of such gaps. One other method of fabricating molecular-scale gaps is based on electromigration. While, using electromigration has a self-termination method, and can achieve a molecule-size gap, the gap width cannot be controlled.

Therefore, a need exists for an apparatus and method for fabricating atomic-scale contacts and gaps that can be easily removed from the apparatus, can create molecule-size gaps while sufficiently controlling gap width, has a built-in self-termination method, and is suitable for mass-fabrication and mass-production, reducing cost of manufacture.

BRIEF DESCRIPTION OF THE DRAWINGS

In FIG. 7, two palladium (Pd) nanoelectrodes 50 are separated by atomic-scale gap 52. Pd nanoelectrodes 50 are disposed adjacent to a solid state substrate 54. An atomic-scale gap 52 is formed between Pd nanoelectrodes 50 using the disclosed method. Atomic-scale gap 52 between Pd nanoelectrodes 50 is less than 10 nm. At a distance of less than 10 nm, the tunneling current between Pd nanoelectrodes 50 can be determined by meter 56. When hydrogen molecules ($H_2$) 58 are exposed to Pd nanoelectrodes 50, each hydrogen molecule 58 that absorbs onto Pd nanoelectrodes 50 breaks into two hydrogen atoms (H) 60.

DETAILED DESCRIPTION OF VARIOUS EMBODIMENTS

This description discloses an apparatus and method for fabricating self-terminating molecular-scale and atomic-scale contacts and gaps between two metal electrodes and applications thereof.

Figure 1:
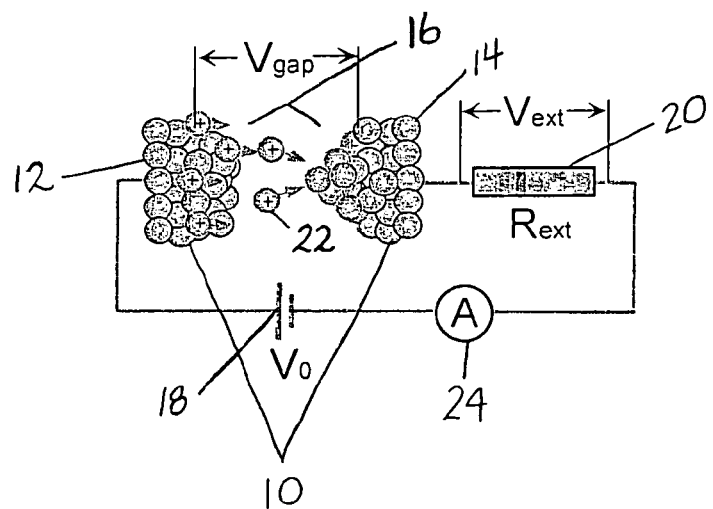
FIG. 1 is an illustration of an apparatus in which the method can be practiced.

FIG. 1 illustrates a general overview of one embodiment of an apparatus used for making molecular-scale and atomic-scale contacts and gaps. In FIG. 1, electrodes 10, including a first electrode, anode 12, and a second electrode, cathode 14, are separated by gap 16 in an electrolyte. Electrodes 10 can be made of any metal, including copper, gold, silver, aluminum, platinum, palladium, nickel, cobalt, and iron. A power source 18, a resistor 20, and a meter 24 are electrically coupled in series between the first electrode, anode 12, and the second electrode, cathode 14. Cathode 14 is coupled to a resistor 20 in a series. Resistor 20 includes any commercially available resistor, any electronic element with resistance, or any other material with resistance.

Both anode 12 and cathode 14 are coupled to a power source 18. Power Source 18 is preferably a DC source capable of supplying a bias voltage. Power source 18 is used to apply a bias voltage between the two electrodes. Meter 24 is capable of determining a change in conductance between anode 12 and cathode 14. The change in conductance can be determined or measured in terms of resistance, current, voltage, or by other electronic means.

As the bias voltage is applied, metal atoms are etched off anode 12 and dissolved into the electrolyte as metal ions 22, which are then deposited onto cathode 14. The electrolyte may be water or any other suitable electrolyte. In one embodiment a fixed bias voltage of less than 26 mV is maintained to reduce instability caused by the electromigration of metal ions 22. Metal ions 22 may be etched off over the entire surface of anode 12. However, the electric field guides the dissolved metal ions 22 and deposits metal ions 22 onto the sharpest point of cathode 14.

Consequently, metal ions 22 are deposited in such a manner that decreases the gap between electrodes 10, until a molecular-scale or an atomic-scale gap exists between electrodes 10. Once the gap completely closes, an atomic-scale contact is formed between electrodes 10.

In order to fabricate an atomic-scale contact or gap between electrodes 10, the etching and deposition process is self-terminated once a desired gap width or in the alternative, a contact, is formed. Self-termination of the process is accomplished by coupling one electrode to resistor 20.

The effective voltage, or overpotential, for etching and deposition of metal ions is determined by the equation:

$$V_{gap} = \frac{R_{gap}}{R_{gap} + R_{ext}} V_0$$

Where $R_{gap}$ is the gap resistance of gap 16 between electrodes 10, and $V_0$ is the total applied bias voltage from power source 18. $R_{gap}$ is determined by electron-tunneling across gap 16 and by ionic conduction, or leakage current, between electrodes 10. In one embodiment, the ionic conduction or leakage current can be reduced by electrically insulating all but the tips of electrodes 10. Epoxy, wax, silicon nitride or other insulating materials can be used.

Prior to application of the bias voltage by power source 18, gap 16 is initially large; therefore when the bias voltage is first applied, the gap resistance is greater than the resistance of resistor 20. Thus, almost the entire applied bias voltage is used for etching and deposition, so that the voltage used in the etching or deposition process, or $V_{gap}$, is approximately equal to the total applied voltage, or $V_0$. At this point, the etching and deposition of metal ions 22 occurs at a high rate. However, as gap 16 decreases due to deposition of metal ions 22 on cathode 14, the tunneling current increases between electrodes 10. The increased tunneling current results in a decrease in the total amount of applied voltage used in the etching and deposition process, and thus a slowdown in the etching and deposition process. Therefore, $V_{gap}$ decreases according to the above equation.

Eventually, the resistance of gap 16 decreases to less than the resistance of resistor 20 and continues decreasing. As the resistance of gap 16 decreases, the etching and deposition process self-terminates, as indicated by meter 24. Upon self-termination, either a molecular-scale or atomic-scale gap between electrodes 10, or an atomic-scale contact between electrodes 10, is formed, depending on the size of resistor 20. If it is desired to form an atomic-scale contact between electrodes 10, then resistor 20 should be less than or approximately equal to 12.7 kΩ. Once an atomic-scale contact is formed between the electrodes, the electron-tunneling is replaced with ballistic transport. However, by increasing resistor 20 above 12.7 kΩ, atomic-scale gaps can be fabricated between electrodes. The width of the atomic-scale gap depends on the magnitude of resistor 20.

The self-termination effect according to one embodiment, is further enhanced by the dependence of the etching and deposition current density on the resistance of gap 16. Where J is the etching and deposition current density, the self-termination effect is enhanced exponentially according to the following equation: $J(V_{gap}) \propto \exp(\alpha e V_{gap}/k_B T)$.

Figure 2:
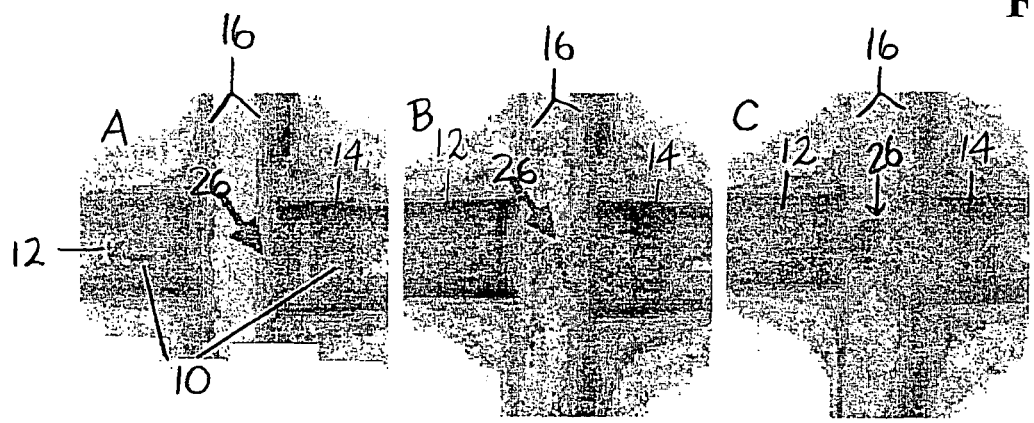
FIG. 2 is a micrograph illustration of the method.

In FIGS. 2a–2c, a micrograph of the formation of an atomic-scale contact is shown. In FIG. 2a, electrodes 10 are shown separated by gap 16. In FIG. 2a, a 1.2 total bias voltage ($V_0$) is applied to the circuit from the power source. Electrochemical disposition does not occur immediately in FIG. 2a. An induction time ranging from a few seconds to a few minutes typically occurs in order for the etching process to build up enough metal ions in the gap to reach a sufficient concentration in order to begin the deposition process. FIG. 2b shows the beginning of the deposition process. In FIG. 2b, the metal ions are thereafter deposited on the sharpest point of the of the cathode 14, forming a growing cathode 26, and pointing toward anode 12. As was noted above, growing cathode 26, as a result of continued deposition of metal ions reduces the gap between anode 12 and cathode 14, and closes the gap between anode 12 and cathode 14, as shown in FIG. 2c. Once growing cathode 26 reaches anode 12, an atomic-scale contact is formed. Once the contact is formed, the process self-terminates, as controlled by the magnitude of the resistor in the circuit. Contacts of different sizes and gaps of different widths are formed by varying the magnitude of the resistor in the circuit.

Figure 3:
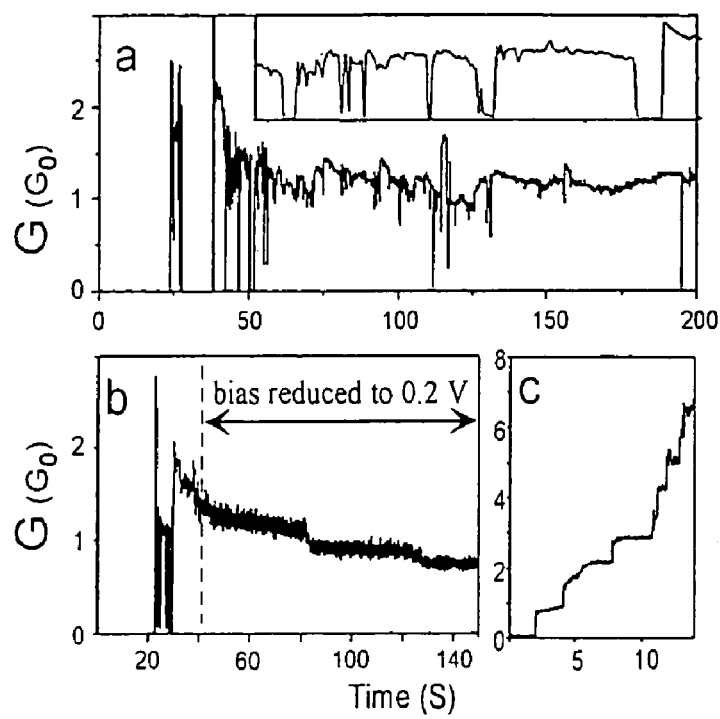
FIGS. 3a–c are graphs illustrating the formation and conductance of an atomic-scale contact.

FIG. 3a is a graph showing the conductance (G, as normalized against $G_0$) over time in seconds (s), between two copper electrodes during the electrochemical etching and deposition in water with the resistor of approximately 3 kΩ. As was noted above, because the resistor has a resistance of less than 12.7 kΩ, an atomic-scale contact will be formed. The initial conductance due to ionic conduction is small compared to $G_0$. A few minutes after applying a total voltage ($V_0$) of 1.2 volts (V), the conductance jumps to approximately 2 $G_0$, and the deposition terminates itself as a contact is formed between the electrodes. However, the initial contact breaks within seconds, and the conductance drops back to zero. The drop in conductance reactivates the deposition process, and the contact is reformed a few seconds later, here with a conductance (G) near 1 $G_0$. While conductance tends to stabilize, fluctuations in the conductance ranging from about 1 $G_0$ to about 0 $G_0$ are detectable, corresponding to this constant breakdown and reformation of the contact. These fluctuations are illustrated in more detail in the inset graph on the upper right hand corner of FIG. 3a.

The fluctuations in FIG. 3a can be attributed to the magnitude of the applied bias voltage. When the magnitude of the applied bias voltage is decreased, the fluctuation in conductance, due to constant breakdown and reformation of the atomic-scale contact, is also reduced. FIG. 3b is a graph illustrating the conductance of an atomic-scale contact formed by reducing the total applied voltage from 1.2 V to 0.2 V after the first 20 seconds after formation of the contact. The reduction of the total bias voltage largely reduces the conductance fluctuations seen in FIG. 3a.

In FIG. 3c, a smaller resistor of 1 kΩ was used to form the atomic-scale contact. The graph in FIG. 3c shows that a resistor of smaller magnitude results in a higher conductance contact which increases in a stepwise fashion, before reaching its final value.

Figure 4:
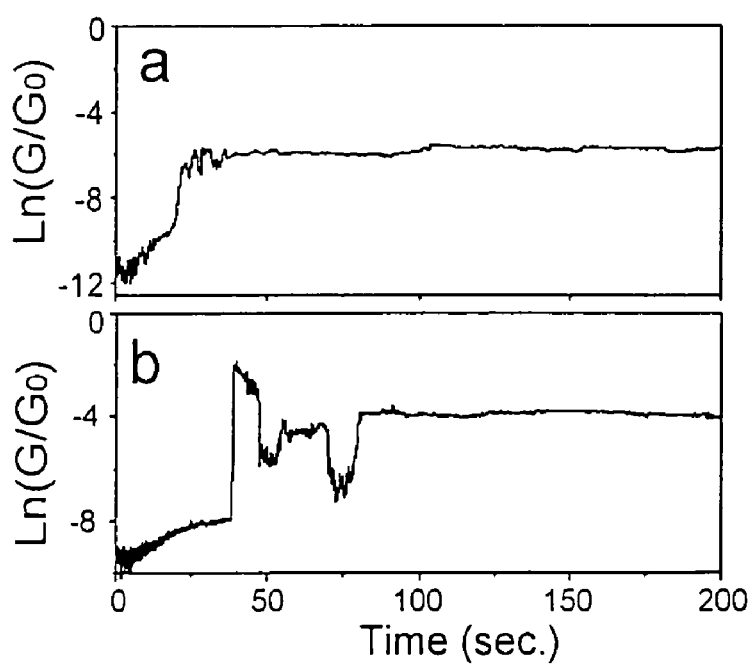
FIGS. 4a–b are graphs illustrating the formation and conductance of an atomic-scale gap.

By increasing the magnitude of the resistor above 12.7 kΩ, molecular-scale and atomic-scale gaps can be fabricated. In FIG. 4a, the graph shows the conductance (G, normalized against $G_0$), in a logarithmic scale, over time in seconds (s), during the etching and deposition process. In FIG. 4a, the magnitude of the resistor is 1 MΩ. In FIG. 4a, the leakage current increases gradually over time after applying a voltage of 1.2 V, due to the ionic concentration in the gap region. Following the gradual increase in leakage current, the conductance increases sharply, due to the increase in tunneling current between the electrodes. The tunneling current between the electrodes increases significantly, even exponentially, with a decrease in the gap width. The conductance increase results in a sudden drop in the etching and deposition process, and eventually terminates the process. The point at which the etching and deposition process terminates depends on the magnitude of the resistor. FIG. 4b shows a graph of a second experiment under the same conditions as FIG. 4a. In FIG. 4b fluctuations in conductance were observed between 50 and 100 seconds due to the etching and deposition of individual metal ions in the gap.

Figure 5:
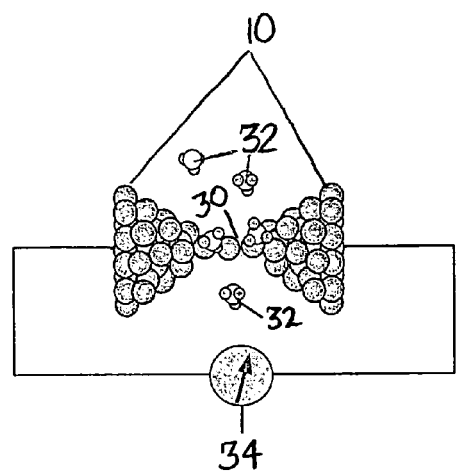
FIG. 5 is an illustration of a chemical nanosensor apparatus made in accordance with the method.

The disclosed method for making atomic-scale contacts and atomic-scale gaps can be used to make several types of sensors and nanosensors. FIG. 5 illustrates a chemical nanosensor. In FIG. 5, an atomic-scale contact 30 has been formed using the above-described method. Electrodes 10 are shown in a circuit, connected by atomic-scale contact 30. The conductance of atomic-scale contact 30 is quantized and dominated by a few atoms at atomic-scale contact 30. Adsorption of even a single molecule 32 onto atomic-scale contact 30 can lead to a large changes in conductance, as detected by meter 34. A change in conductance can be determined or measured in terms of a resistance, current, voltage, or by other electronic means.

Figure 6:
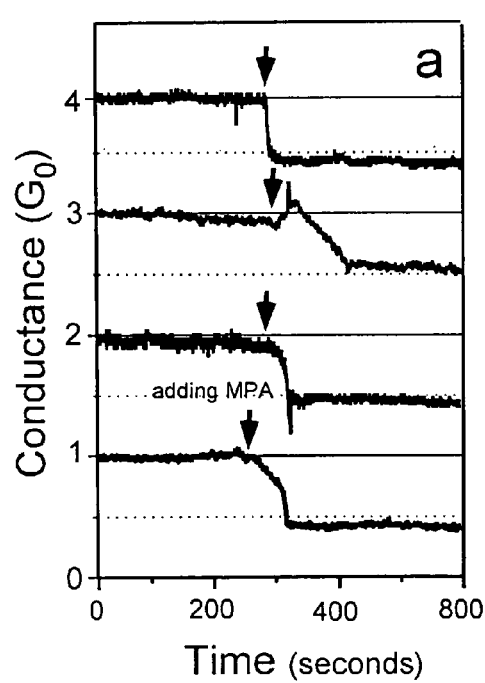
FIGS. 6a–b are graphs showing the detection of different chemicals by a chemical nanosensor made in accordance with the method.
Figure 6:
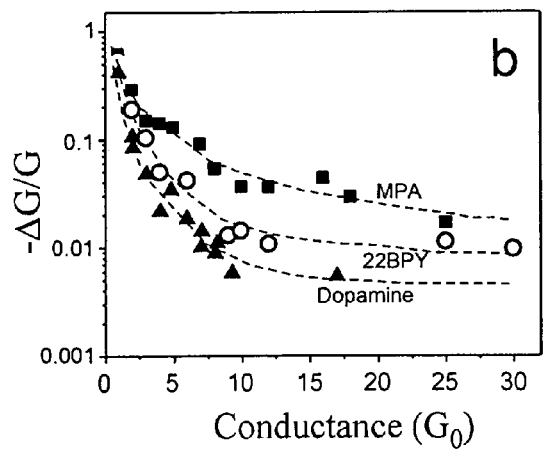

The apparatus illustrated in FIG. 5 can be used to detect small traces of toxic molecules in either the air, or in a solution. As shown in the graph in FIG. 6a, the conductance drops abruptly to a fractional value of the original conductance upon absorption of toxic molecules. In FIG. 6a, copper electrodes were used to make a copper atomic-scale contact, or nanowire. Mercaptopropionic acid (MPA) was added to a solution containing the chemical nanosensor. As shown in FIG. 6a, MPA is added to the solution at approximately 250 seconds. The MPA is detected a few seconds later by a sharp drop in the conductance upon absorption of MPA by the atomic-scale contact.

FIG. 6b is a logarithmic graph illustrating the drop in conduction of a copper atomic-scale contact, or nanowire of MPA, 2,2'-Bipyridine (22BPY), and Dopamine. Each molecule causes a drop in conductance to occur in the atomic-scale contacts. The variations in conduction decrease between the different molecules is a function of the binding strength of the molecules to the copper wire. The stronger a molecule's affinity is for binding to the particular metal used, in this instance, copper, the larger the decrease in conductance.

Figure 7:
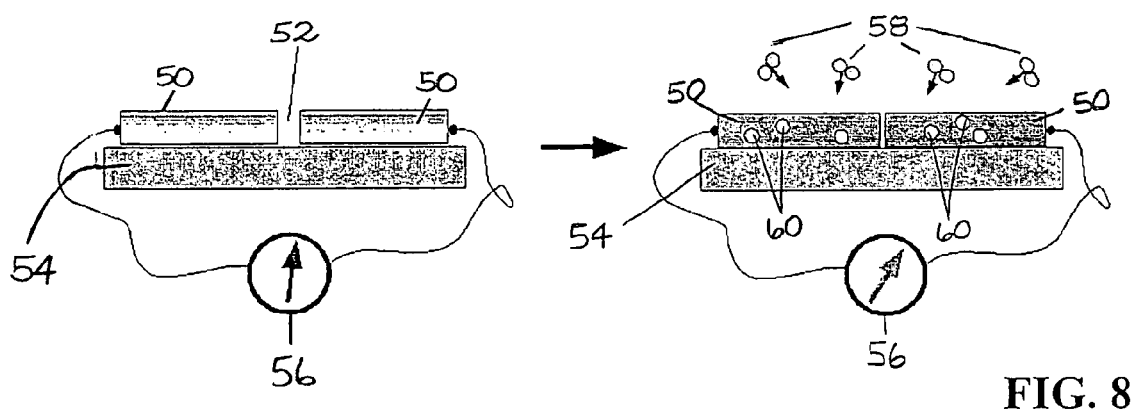
FIG. 7 is an illustration of one embodiment of a hydrogen sensor made in accordance with the above-described method.

FIG. 7 is an illustration of one embodiment of a hydrogen sensor made in accordance with the above-described method. In FIG. 7, two palladium (Pd) nanoelectrodes 50 are separated by atomic-scale gap 52. Pd nanoelectrodes 50 are disposed adjacent to a solid state substrate 54. An atomic-scale gap is formed between Pd nanoelectrodes 50 using the disclosed method. Atomic-scale gap 52 between Pd nanoelectrodes 50 is less than 10 nm. At a distance of less than 10 nm, the tunneling current between Pd nanoelectrodes 50 can be determined by meter 56. When hydrogen molecules ($H_2$) 58 are exposed to Pd nanoelectrodes 50, each hydrogen molecule 58 that absorbs onto Pd nanoelectrodes 50 breaks into two hydrogen atoms (H) 60.

Hydrogen atoms 60 diffuse into Pd nanoelectrodes 50, causing expansion of Pd nanoelectrodes 50. At room temperatures, Pd nanoelectrodes 50 can absorb hydrogen atoms 60 up to 900 times its own volume. The diffusion time of hydrogen atoms 60 into Pd nanoelectrodes 50 can be decreased by increasing the surface-to-volume ratio of Pd nanoelectrodes 50. A large surface-to-volume ratio allows hydrogen atoms to diffuse quickly from the surface to the interior.

The expansion of Pd nanoelectrodes 50 decreases molecular-scale or atomic-scale gap 52. The decrease in atomic-scale gap 52 causes an increase in the tunneling current. The increase in tunneling current is an exponential function of the width of atomic-scale gap 52. Therefore, a small change in the width of atomic-scale gap 52, even the size of a single atom, will trigger a two to three order of magnitude change in the tunneling current. Therefore, extremely sensitive hydrogen sensors can be constructed according to this embodiment.

Figure 8:
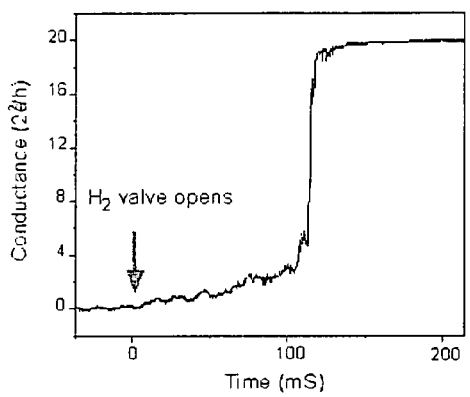
FIG. 8 is a graph showing the detection of hydrogen molecules by a hydrogen sensor made in accordance with the method.

FIG. 8 is a graph showing the conductance (in quantum units) of an atomic-scale gap formed between a pair of Pd nanoelectrodes, over time in milliseconds (mS). The atomic-scale gap was formed with the self-termination method disclosed. The nanoelectrodes were disposed adjacent to a glass slide mounted in a chamber. The chamber was then exposed to a source of hydrogen gas. In FIG. 8, nitrogen gas, containing approximately 7% hydrogen molecules, was used.

Before exposing the atomic-scale gap to hydrogen gas, the conductance is small. At time 0, the valve was opened, exposing the chamber to the source of hydrogen gas. At about time 100, as the Pd nanoelectrodes expanded, a large increase in the conductance occurs due to a decreased gap. Shortly thereafter, the gap is closed to zero, forming a contact between the Pd nanoelectrodes. The contact is detected by an increase of the conductance to a specific value. As noted above, a change in conductance can be determined or measured in terms of a resistance, current, voltage, or other electronic means.

The response time of 100 mS is limited by the finite speed of the valve opening process and the diffusion of hydrogen atoms to the nanoelectrodes. The actual response time of the hydrogen sensor itself is actually orders of magnitude faster. Therefore, a hydrogen sensor constructed according to the method provides for a highly sensitive, fast response hydrogen nanosensor. In a further embodiment, since the hydrogen sensor changes from an open circuit to a closed circuit, the apparatus may by used as a hydrogen gas switch or relay.

Figure 9:
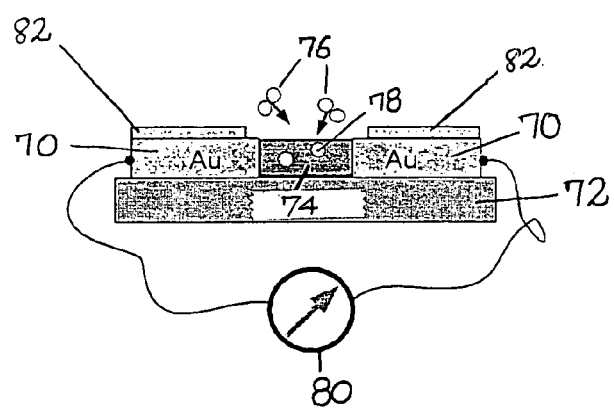
FIG. 9 is a alternate embodiment of a hydrogen sensor made in accordance with the method.

An alternate embodiment of a hydrogen nanosensor is illustrated in FIG. 9. The alternate embodiment includes gold (Au) electrodes 70, insulated with silicon nitride (SiN) 82, disposed adjacent to a solid state substrate 72, and connected in a circuit with meter 80. An atomic-scale gap has been constructed between Au electrodes 70 in accordance with the above-described method. The atomic-scale gap is then filled with palladium (Pd) through electroplating. An Au-Pd-Au atomic-scale contact, or Pd nanojunction 74 made of a small number of Pd atoms, is then formed.

When exposed to hydrogen molecules ($H_2$) 76, the hydrogen molecules 76 are split into hydrogen atoms (H) 78, and penetrate Pd nanojunction 74. Hydrogen atoms 78 penetrate Pd nanojunction 74, changing the conductance of the of the nanowire, as determined by meter 80. Because only a small number of Pd atoms are used as the sensing element, almost every Pd atom comprising Pd nanojunction 74 is ready to bind with hydrogen atoms 78, achieving a sensitive and rapid detection apparatus.

Sensitive and rapid detection of hydrogen molecules will be especially important in hydrogen-fueled vehicles. The highly explosive nature of hydrogen demands a reliable, inexpensive and compact hydrogen sensor. Currently, hydrogen sensor take a minimum of 0.5 seconds to detect hydrogen at a concentration below the lower explosion limit (4% $H_2$ in air). Such a long detection time renders current hydrogen sensors ineffective in monitoring flowing gas streams. The Pd hydrogen sensor fabricated according to the disclosed method has several advantages, including high sensitivity, fast response time, low power consumption, and improved performance in the presence of a high concentration of reactive particles. Furthermore, the hydrogen sensors includes nanojunctions already connected to an external circuit during fabrication. Therefore, the hydrogen sensor can be easily integrated into other electronic systems.

Figure 10:
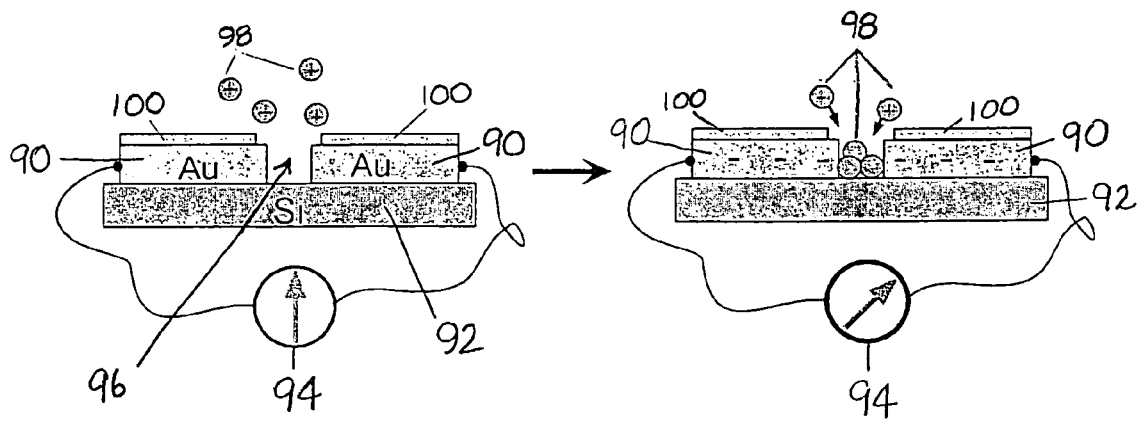
FIG. 10 is an illustration of a heavy metal ion nanosensor apparatus made in accordance with the method.

FIG. 10 illustrates a heavy metal ion sensor. In FIG. 10, two gold (Au) electrodes 90, insulated with silicon nitride (SiN) 100 are disposed adjacent to a silicon (Si) chip 92, and connected in a circuit to meter 94. Silicon chip 92 supports Au electrodes 90. An atomic-scale gap 96 has been fabricated between Au electrodes 90 in accordance with the above-described method. The apparatus is then exposed to water or other solution containing heavy metal ions 98. Heavy metal ions 98 can be any metal ions, for example, copper or lead. The apparatus is held at a negative potential to allow electrodeposition of heavy metal ions 98 into atomic-scale gap 96. Once deposited, heavy metal ions 98 bridge atomic-scale gap 96, an increase in the conductance between Au electrodes 90 is detected by meter 94. In accordance with the above-described method, molecular-scale or atomic-scale gap 96 can be as narrow as a single atom to a few atoms, or large enough for several atoms or molecules. Therefore, deposition of only a few heavy metal ions 98 into atomic-scale gap 96 is enough to trigger a measurable change in conductance by meter 94, thus providing for a sensitive detection of heavy metal ions 98. As noted above, the change in conductance can be determined or measured in terms of a resistance, current, voltage, or by other electronic means.

Specificity for different heavy metal ions 98 can be achieved by employing the principle that different metal ions have different reduction-oxidation (redox) potentials. By using a specific negative potential, correlating to the redox potential of a specific metal ion, in the deposition process, specific heavy metal ions, such as copper or lead can be detected. Therefore, heavy metal ion sensors can be used to detect one or more particular and identifiable type of heavy metal ion.

Figure 11:
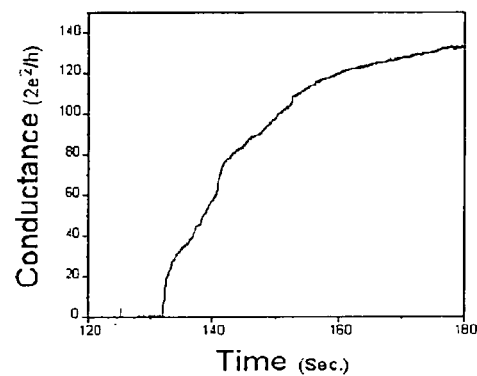
FIG. 11 is a graph showing the detection of a copper ion by a heavy metal ion sensor produced according to the method.

FIG. 11 is a graph of a copper ion ($Cu^{2+}$) sensor. In FIG. 5, a pair of Au nanoelectrodes were used to form an atomic-scale gap between the Au nanoelectrodes, forming a heavy metal ion sensor. The heavy metal ion sensor was then immersed in a 1.0 micro-Molar (μM) $Cu^{2+}$ solution. A negative potential specific for $Cu^{2+}$ ions is then applied to the Au nanoelectrodes, causing electrodeposition of the $Cu^{2+}$ ions. Electrodeposition of the $Cu^{2+}$ ions present in the solution then bridges the atomic-scale gap.

The graph in FIG. 11 shows the increase in conductance of the heavy metal ion sensor, here specifically a copper ion sensor, over time in seconds (s). At approximately time 130 s, conductance of the copper ion sensor begins to increase dramatically as $Cu^{2+}$ ions begin to bridge the atomic-scale gap. At approximately 160 seconds, the atomic-scale gap has been filled with $Cu^{2+}$ as the conductance stabilizes between 130 and 140. The time it takes to bridge the atomic-scale gap depends on the concentration of $Cu^{2+}$ ions in the solution.

Figure 12:
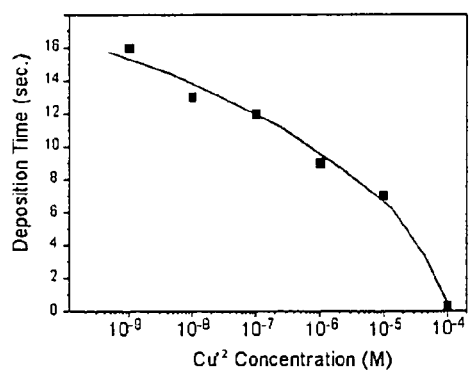
FIG. 12 is a graph showing the sensitivity by a heavy metal ion sensor produced according to the method to low concentrations of copper ions.

FIG. 12 plots the deposition time in seconds (s) versus $Cu^{2+}$ concentration in Molars (M). As shown in FIG. 12, deposition time increases as the concentration of $Cu^{2+}$ ions in the solution decreases. Using the copper ion sensor fabricated through the disclosed method, $Cu^{2+}$ concentrations as low as 1.0 nano-Molar (nM), $10^{-9}$ M in FIG. 12, can be detected in approximately 16 s. This sensitivity of detection corresponds to 0.1 parts-per-billion (ppb) which is four orders of magnitude lower than required by the current EPA standard of 1000 ppb.

Figure 13:
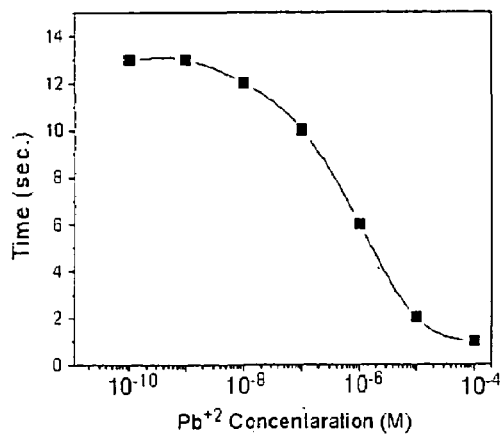
FIG. 13 is a graph showing the sensitivity by a heavy metal ion sensor produced according to the method to low concentrations of lead ions.

FIG. 13 illustrates the high sensitivity of a lead ion ($Pb^{2+}$) sensor constructed according to the disclosed method. In FIG. 13, the concentration of $Pb^{2+}$ in Molars (M). $Pb^{2+}$ concentrations as low as 0.01 ppb (100 pM) can be detected in approximately 13 s by the heavy metal ion sensor. This sensitivity is three orders of magnitude lower than that required by the current EPA standard of 10 ppb.

The threat of heavy metal pollution in the environment can cause toxicity to a broad range of living organisms. Current sensors fail to detect heavy metal ions at a small enough concentration to prevent contamination, but rather, by the time heavy metals are detected, they have reached contaminating concentrations. Heavy metal ion sensors constructed according to the present method provide early detection of trace metal contaminants on site (in situ detection). Therefore, advantages of this embodiment include minimized errors and decreased labor and cost associated with collection, transport, and storage of samples for laboratory analysis. The heavy metal ion sensors will be useful in all industries subject to EPA regulations.

Figure 14:
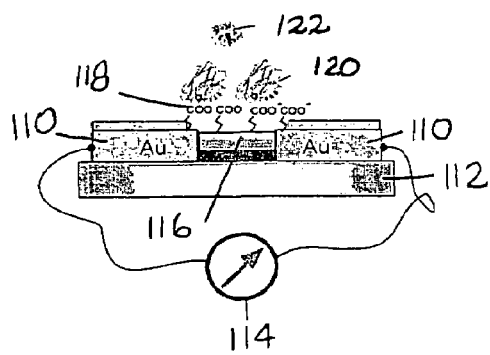
FIG. 14 is an illustration of biosensor apparatus made in accordance with the method.

FIG. 14 illustrates a biosensor made according to the above-described method. In FIG. 14, two gold (Au) electrodes 110 are used in fabricating an atomic-scale gap between Au electrodes 110. Au electrodes 110 are disposed adjacent to solid state substrate 112, and connected in a circuit with meter 114. The atomic-scale, or nanogap, is then bridged with a metal oxide. Metal oxides include tin oxide ($SnO_2$), titanium oxide ($TiO_2$) and ruthenium oxide ($RuO_2$). Thus, a metal oxide nanojunction 116 is formed between Au electrodes 110. Metal oxides are chosen for biosensors because they are semiconductive and their surfaces can be easily functionalized with an organic monolayer that allows various receptor molecules to be immobilized on the surface.

In FIG. 14, an organic layer 118, for example an organic monolayer made of carboxyl ion ($COO^-$) molecules is attached to metal oxide nanojunction 116. Biological receptor molecules 120 are then immobilized onto organic layer 118 and consequently metal oxide nanojunction 116. Biological receptor molecules 120 retain intact biological function. Therefore, biological receptor molecules 120 will continue to specifically bind to their target molecule 122.

A specific binding of target molecule 122 with biological receptor molecule 120 will trigger a change in the conductance as detected by meter 114. As noted above, the change in conductance can be determined or measured in terms of a resistance, current, voltage, or by other electronic means. In this manner the biosensor converts the biological binding event into an electrical signal. Examples of receptor-target bindings include enzyme-substrate, antibody-antigen and complementary DNA strands.

Biosensors fabricated according to the present method can be used in numerous application including detecting antibodies in biomedical diagnostics, functioning as gene probes where DNA or RNA binds to defined-sequences in target analytes, inspection of food freshness or biological contamination, and early alert biological warfare agents. Biosensors fabricated according to the present method have several advantages including high sensitivity, fast response time, miniaturized devices, potential for integration of the biosensor into other electrical systems, reduced labor and expense in eliminating tagging DNA molecules with fluorescence or dye, and eliminating the need for expensive optical detection systems.

In accordance with the above-described method, molecular-scale gaps can be fabricated as molecular sensors for use in chemical and biological applications. Electrodes separated with a molecular-scale gap are bridged with an unknown molecule. Because different molecules have different electrochemical potentials, the identity of a particular molecule can be correlated with its specific electrochemical potential. Therefore, by determining the electrochemical potential of a molecule as electrons pass across the molecule between electrodes, the sensor can detect the particular identity of the molecule.

Figure 15:
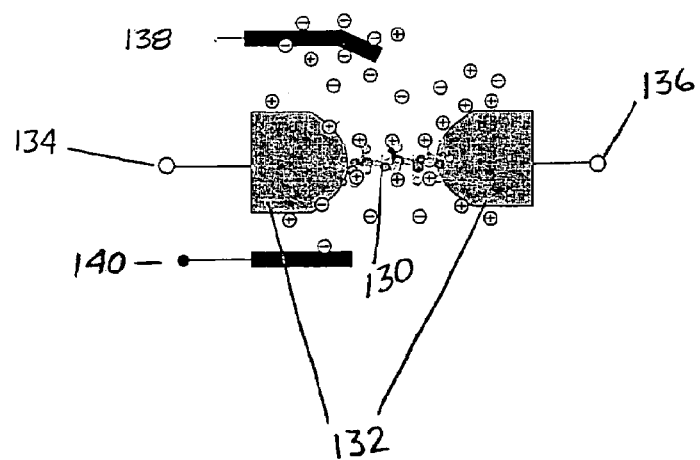
FIG. 15 is an illustration of a molecular switch made in accordance with the method.

Molecular switches can also be constructed by first fabricating molecular-scale gaps in accordance with the above-described method, and then bridging the gap with a known molecule, for example, polyaniline 130. In FIG. 15, polyaniline 130 bridges the molecular-scale gap between two electrodes 132. In the molecular switch, electrodes 132 serve as a source 134 and a drain 136. A reference electrode 138 that controls the electrochemical potential of polyaniline 130 is introduced into the electrolyte. In a field effect transistor, counter electrode 140 can be used in conjunction with reference electrode 138 which serves as the gate electrode to switch polyaniline 130 between insulating and conducting states.

Figure 16:
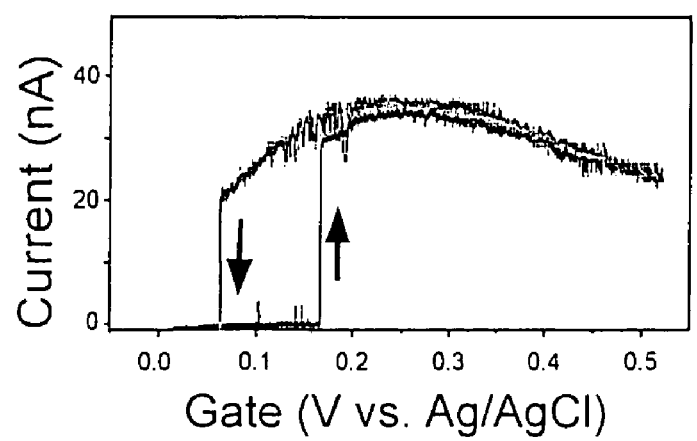
FIG. 16 is a graph showing reversible digital switching behavior of a molecular switch made in accordance with the method.

In FIG. 16, the graph shows the electron transport current through polyaniline versus electrochemical gate voltage. The source-drain bias voltage in each case is 20 mV. The graph illustrates the reversible digital switching behavior of the polyaniline switch. Molecular switches can be used to process digital signals and can be used instead of silicon-based semiconductor chips.

Magnetoresistive devices and sensors can also be made in accordance with the above-described method. An atomic-scale contact is formed using electrodes of metals or metal alloys with a large magnetoresistance, including, but not limited to, cobalt (Co), iron (Fe), nickel (Ni), or any alloy thereof. For example, Ni has a ballistic magnetoresistance of up to 700%. A magnetoresistive sensor made of an atomic-scale contact is capable of detecting a very small change in magnetic field, providing increased sensitivity.

An alternate embodiment of a magnetoresistance sensor uses a molecular or atomic-scale gap between the electrodes. A magnetoresistive metal is then used to substantially bridge the molecular or atomic-scale between electrodes.

Various embodiments of the invention are described above in the Drawings and Description of Various Embodiments. While these descriptions directly describe the above embodiments, it is understood that those skilled in the art may conceive modifications and/or variations to the specific embodiments shown and described herein. Any such modifications or variations that fall within the purview of this description are intended to be included therein as well. Unless specifically noted, it is the intention of the inventor that the words and phrases in the specification and claims be given the ordinary and accustomed meanings to those of ordinary skill in the applicable art(s). The foregoing description of a preferred embodiment and best mode of the invention known to the applicant at the time of filing the application has been presented and is intended for the purposes of illustration and description. It is not intended to be exhaustive or to limit the invention to the precise form disclosed, and many modifications and variations are possible in the light of the above teachings. The embodiment was chosen and described in order to best explain the principles of the invention and its practical application and to enable others skilled in the art to best utilize the invention in various embodiments and with various modifications as are suited to the particular use contemplated. Therefore, it is intended that the invention not be limited to the particular embodiments disclosed for carrying out this invention, but that the invention will include all embodiments falling within the scope of the appended claims.

What is claimed is:

1. A nanosensor, comprising:
   a first electrode; and
   a second electrode, separated from the first electrode by a first gap, wherein a second gap was decreased to form the first gap by:
   electrically coupling a resistor in series with the second electrode to form a circuit including the first electrode, the second electrode and the resistor;
   applying a bias voltage across the circuit, the bias voltage having a magnitude sufficient to etch ions from the first electrode and deposit the etched ions onto the second electrode; and
   maintaining the application of the bias voltage at least until the etching and deposition of the ions substantially ceases.

2. The nanosensor in claim 1, further comprising a means for determining conductance between the first electrode and the second electrode.

3. The nanosensor in claim 1, wherein the gap is decreased to molecular-scale.

4. The nanosensor in claim 1, wherein the gap is decreased to atomic-scale.

5. The nanosensor in claim 1, wherein the gap is decreased to approximately zero.

6. The nanosensor in claim 1, wherein the gap is decreased until a contact is formed between the first electrode and the second electrode.

7. The nanosensor in claim 1, wherein the nanosensor is used to detect the presence of a chemical, wherein the nanosensor detects the presence of the chemical by the conductance determining means indicating a change in conductance.

8. The nanosensor in claim 1, wherein the nanosensor is used to detect the presence of hydrogen, wherein the nanosensor detects the presence of hydrogen by the conductance determining means indicating a change in conductance.

9. The nanosensor in claim 8, wherein the first electrode and the second electrode comprise palladium.

10. The nanosensor in claim 1, wherein the nanosensor is used to detect the presence of heavy metals ions, wherein the nanosensor detects the presence of the heavy metal ions by the conductance determining means indicating a change in conductance.

11. The nanosensor in claim 1, wherein the nanosensor is used to detect the presence of biological molecules, wherein the nanosensor detects the presence of the biological molecules by the conductance determining means indicating a change in conductance.

12. The nanosensor in claim 1, further comprising:

a metal oxide disposed between the first electrode and the second electrode, wherein the metal oxide substantially bridges the gap between the first electrode and the second electrode;

an organic layer disposed adjacent to the metal oxide; and a biological receptor disposed adjacent to the organic layer.

13. The nanosensor in claim 1, wherein the first electrode and the second electrode comprise a metal with magnetoresistance.

14. The nanonsensor in claim 13, wherein the nanosensor is used to detect a change in magnetic field.

15. The nanosensor in claim 1, wherein a material with magnetoresistance substantially bridges the gap between the first electrode and the second electrode.

16. The nanosensor in claim 15, wherein the nanosensor is used to detect a change in magnetic field.

* * * * *